(12) United States Patent
Balboni

(10) Patent No.: US 7,999,599 B2
(45) Date of Patent: Aug. 16, 2011

(54) ADAPTIVE BIAS CIRCUIT

(75) Inventor: Edmund J. Balboni, Littleton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/625,016

(22) Filed: Nov. 24, 2009

(65) Prior Publication Data

US 2010/0127756 A1    May 27, 2010

Related U.S. Application Data

(60) Provisional application No. 61/118,195, filed on Nov. 26, 2008.

(51) Int. Cl.
*G06G 7/12*      (2006.01)

(52) U.S. Cl. .................. 327/358; 327/355; 455/326

(58) Field of Classification Search .......... 327/355–361, 327/103; 455/326, 333, 323
See application file for complete search history.

(56) References Cited

U.S. PATENT DOCUMENTS

| | | | | |
|---|---|---|---|---|
| 5,683,135 | A  * | 11/1997 | Williams | 297/159.1 |
| 6,404,284 | B1 | 6/2002 | Johnson | |
| 6,983,135 | B1 * | 1/2006 | Tsai et al. | 455/234.1 |
| 7,382,175 | B2 * | 6/2008 | Maruyama et al. | 327/359 |
| 7,403,758 | B2 * | 7/2008 | Rector | 455/232.1 |
| 7,405,608 | B2 * | 7/2008 | Filoramo et al. | 327/359 |
| 7,425,868 | B2 * | 9/2008 | Ju | 330/259 |

* cited by examiner

*Primary Examiner* — Dinh T. Le
(74) *Attorney, Agent, or Firm* — Knobbe Martens Olson & Bear LLP

(57) ABSTRACT

Disclosed are apparatus and methods for electronic signal conversion in which a power level of the signal is used to adjust the bias current of a converter.

25 Claims, 2 Drawing Sheets

ADAPTIVE BIAS CIRCUIT

CROSS-REFERENCE TO RELATED APPLICATION

The present invention claims priority to and the benefit of U.S. Provisional Patent Application No. 61/118,195, filed on Nov. 26, 2008, the entire disclosure of which is hereby incorporated by reference.

FIELD OF THE INVENTION

The present invention relates generally to electronic signal processing and, more specifically, to circuits with adjustable bias currents.

BACKGROUND

Radio-frequency (RF) mixers often use active voltage-to-current converters at the RF input. The transistors and resistors in the converters generate shot noise and thermal noise, respectively, which affect the signal-to-noise ratio (SNR) of the circuit. Shot noise power is proportional to the bias current of the converter. Therefore, to keep noise levels low, it is desirable to use low bias currents. On the other hand, bias currents are needed to shift the signals to levels in which conversion is approximately linear, i.e., in which a change in the input signal voltage results in a proportional change in the output current. When bias currents are too low, the signals are distorted. Consequently, setting the bias current implies a trade-off between noise and distortion.

Current approaches to overcome this problem include CMOS passive mixers, and inductive mixer degeneration. Both approaches, however, result in narrow-band mixers. CMOS mixers tend to be large to reduce transistor resistance, which increases their capacitance, thereby limiting bandwidth. In inductive degeneration, the inductors used resonate against the transistor capacitance likewise limiting bandwidth. Accordingly, there is a need for high-linearity, low noise converters that can be used over a wide bandwidth.

SUMMARY

The present invention ameliorates the trade-off between noise and distortion in electronic circuits by setting a bias current based on the strength of the input signal. A power detector measures a power level of the input signal and supplies a bias adjust signal to a component of the circuit, such as a voltage-to-current converter of a mixing circuit, so as to increase the bias current in that component substantially monotonically (e.g., linearly) with the measured power level.

In one aspect, various embodiments of the invention provide an apparatus, including a converter and a power detector, for processing an electronic signal. An input port of the converter receives the electronic signal. The power detector measures a power level of the electronic signal, and adjusts a bias current of the converter to a value that increases substantially monotonically with the power level by providing a bias adjust signal to a bias port of the converter. The system may further include a mixer and/or an amplifier coupled to an output port of the converter, and optionally a local oscillator coupled to the mixer. In certain embodiments, the converter is or includes a voltage-to-current converter. The electronic signal may be a radio-frequency signal, and may have a power level in a range from −25 dBm to 0 dBm. The bias current may have a value in the range from 25 mA to 85 mA. In some embodiments, a third-order-intercept input power level is at least 10 dBm, preferably at least 20 dBm, more preferably at least 27 dBm. In some embodiments, a ratio of the SNR of an input signal to the SNR of an output signal is no greater than 20 dB, optionally no greater than 12 dB.

In another aspect, the invention provides a radio-frequency mixer circuit, including a radio-frequency mixer with two differential input ports and a differential output port, a local oscillator coupled to one of the input ports, a transimpedance amplifier coupled to the other input port, and a detector. The transimpedance amplifier converts a radio-frequency input signal voltage into a radio-frequency input-signal current. The detector is configured to measure a power level of the radio-frequency input signal, which it may receive via the transimpedance amplifier, and provides a bias adjust signal indicative of the power level to the transimpedance amplifier. Thereby, bias currents in the transimpedance amplifier and the mixer are adjusted based on the power level of the input signal. The mixer may be a doubly balanced active mixer, and may have a dynamic range of input frequencies form about 100 MHz to about 6 GHz. The bias current in the mixer may be adjustable in a range from 80 mA to 140 mA. In some embodiments, the mixer circuit also includes transformers at the input port of the transimpedance amplifier and the output port of the mixer.

In yet another aspect, the invention provides a method associated with an electronic converter. The method involves providing an electronic signal (such as, e.g., a radio-frequency signal) to an input port of the electronic converter, measuring a power level of the electronic signal (e.g., by converting the radio-frequency signal into a DC output signal), and adjusting a bias current of the electronic converter to a value that increases substantially monotonically with the measured power level (e.g., by providing the DC output signal as a bias-adjust signal to the converter).

BRIEF DESCRIPTION OF THE DRAWINGS

The foregoing discussion will be more readily understood by referring to the following detailed description of the invention in conjunction with the accompanying drawings, in which.

DETAILED DESCRIPTION OF THE INVENTION

Figure 1:
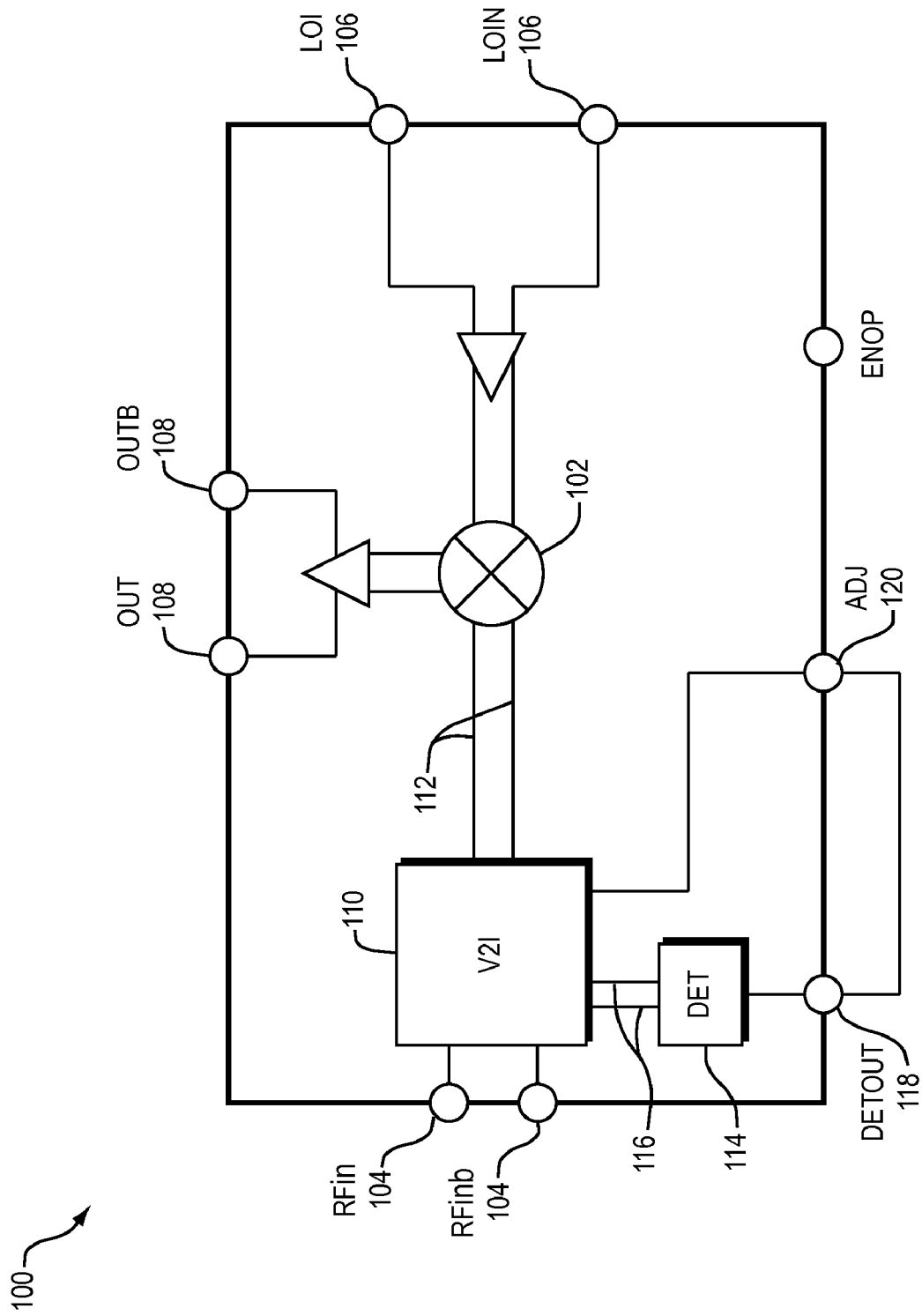
FIG. 1 is a schematic diagram of a mixer with adjustable bias current according to an embodiment of the invention.

Refer to FIG. 1, which illustrates schematically the use of an adaptive-bias converter according to an embodiment of the invention in an exemplary RF mixer circuit 100. The circuit 100 includes an RF mixer 102 which may be, for example, a doubly balanced active mixer with a differential RF input port 104, a differential local oscillator (LO) input port 106, and a differential output port (108). The mixer 102 frequency-translates the RF input signal by combining it with the substantially sinusoidal LO input signal. Due to non-linear behavior of the mixer 102, this combination results in sum-frequency or difference-frequency signals. For example, the mixer may have an output signal at port 108 whose center frequency is the difference between the RF and LO frequencies. Typically, the LO frequency is chosen such that the difference frequency falls in the intermediate frequency (IF) regime (up to about 500 MHz).

The nonlinearity of the mixer 102 can generally be implemented with diodes, bipolar junction transistors (BJTs), field effect transistors (FETs), or any other non-linear electronic component. Depending on the components used, the mixer 102 may be voltage-controlled or current-controlled. For example, when the mixer 102 utilizes bipolar transistors it typically operates with an input current, as assumed for FIG. 1. Therefore, the mixer circuit 100 includes a voltage-to-current (V2I) converter 110, or transimpedance amplifier, at the RF input port 112 of the mixer. The V2I converter 110 converts an input voltage or power into a current signal centered around a bias current $I_B$ which determines the operating point of both V2I converter 110 and mixer 102.

Figure 2:
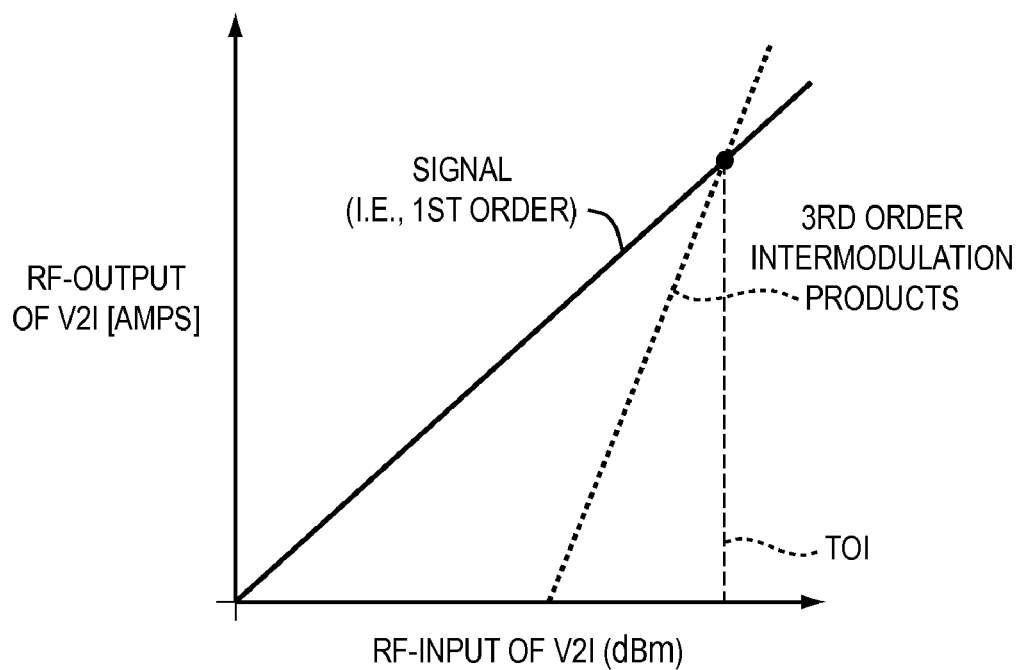
FIG. 2 is a graph illustrating linear and third-order output signal levels as a function of the input signal level.

An ideal V2I converter 110 would provide an output current that is linear with the input voltage or power. However, since the V2I converter 110 contains nonlinear components itself, it can introduce distortion into the signal, e.g., by generating harmonics of the input signal (harmonic distortion) or by mixing various frequency components of the input signal (intermodulation distortion). Higher-order distortion signals generally increase faster with an increasing input signal than the desired linear output signal. This is illustrated in FIG. 2, wherein the RF output current is plotted against the RF input power on logarithmic scales. The logarithm of the input power level relative to 1 mW is expressed in dBm. In FIG. 2, the solid line indicates the linear (i.e., first-order) component at the output, and the dashed line indicates third-order intermodulation products. At lower input power levels, the third-order components are negligible compared with the linear signal. However, the logarithm of the intermodulation products increases at three times the rate of the logarithm of the linear output signal. Therefore, as the input power increases, the level of the third-order components approaches that of the linear component, and eventually exceeds it. The point where the solid and dashed lines intercept, i.e., where the power in the third-order intermodulation products equals the input signal, is called the third-order intercept (TOI) point (also often denoted IP3), and is often used to characterize the linearity of electronic circuits.

Figure 3:
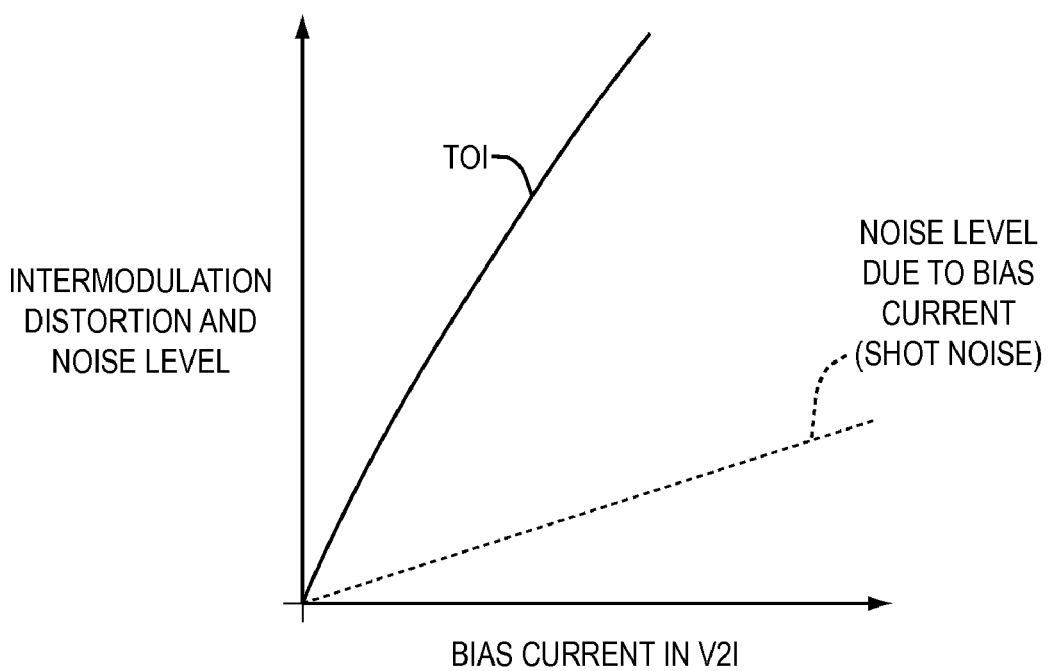
FIG. 3 is a graph illustrating third-order intercept point and noise level as a function of bias current.

With increasing bias current $I_B$, the TOI generally increases, as conceptually illustrated in FIG. 3, in which the TOI input signal power is plotted as a function of the bias current $I_B$. As $I_B$ is raised, the linear components remain almost the same while the third-order components are reduced. A higher TOI allows larger input signals to be converted without significant distortion. In order to enable linearity of the circuit at high signal levels, it is therefore desirable to use large bias currents. The downside of higher bias currents is increased noise. Current in the transistors and diodes of the circuit 100 results in shot noise, i.e., random fluctuations due to the discrete nature of electric charge. Shot noise currents are proportional to the square root of $I_B$ and shot noise power levels are, accordingly, proportional to $I_B$ as indicated in FIG. 3 by the dashed line. Higher noise levels adversely affect the output signal in particular for low input signals as input signals need to be above the noise floor to be detectable. It is therefore desirable to keep bias currents low for small input signals.

Referring back to FIG. 1, system 100 includes a control circuit for improving the trade-off between linearity and noise by adjusting the bias current of the V2I converter 110 based on the signal level at the input port 104. A detector 114 in the feedback loop receives the RF input signal at a detector input port 116. In some embodiments, the V2I converter 110 may serve as a buffer for the RF input signal, which diverts the signal to the detector 114 as illustrated. The detector 114 converts the AC input voltage into a DC output signal which may be proportional to the root mean square (RMS) of the input voltage. A suitable detector is, for example, the AD8362 from Analog Devices, Inc. of Norwood, Mass. In operation of the feedback loop an output port 118 of the detector 114 provides the DC output signal, which serves as a bias adjust signal, to a bias port 120 of the V2I converter 110. The bias adjust signal may be directly used as the bias of the V2I converter 110 or may be further amplified or otherwise processed to set the bias current to a level monotonically increasing with the measured input signal power. In some embodiments, input signal power levels vary between about −25 dBm and about 0 dBm, and result in adjusted bias currents of the V2I converter 110 between about 25 mA and about 80 mA. In the mixer 102, a DC component from the LO signal may shift the overall bias current into a range from 80 mA to 140 mA. The dependence of the mixer bias current on the RF signal level may reduce intermodulation distortion introduced in the mixer stage. In some embodiments, system 100 may further include transformers at the RF input port 104 and the IF output port 108 to fix the overall gain of the circuit, thereby rendering the circuit single-ended for compatibility with other single-ended components.

In certain embodiments, the system 100 operates over a wide band of input signal frequencies, e.g., ranging from 100 MHz to 6 GHz. Its performance may be characterized by high linearity and low noise. For example, the input power corresponding to the TOI may be 27 dBm or more, which is significantly above the expected input signal powers of no more than around 0 dBm. The single-sideband (SSB) noise figure, i.e., the ratio of the SNR at the input to the SNR at the output of system 100, may be 12 dB or less. Such performance characteristics render the circuit suitable for high-demand applications such as, e.g., mobile communication applications. Another advantage of the bias-adjust functionality of system 100 is the low power consumption associated with the decrease in bias currents (i.e., supply currents) for small input signals.

Various embodiments of the present invention involve providing an electronic signal to an input port of an electronic component, such as a converter, measuring a power level of the electronic signal, and adjusting a bias of the electronic component to a value that increases monotonically with the measured power level. Embodiments of the invention are not limited to the above-described application in an RF mixer circuit. Rather, the concepts illustrated with system 100 can be implemented in various contexts. For example, a V2I converter with adjustable bias current may be used at the input port of an amplifier or electronic component. Further, instead of setting a bias current, a control circuit including a power detector may be utilized to set a bias voltage in voltage-controlled applications. Bias-adjust functionality may, moreover, be utilized for electronic signals of any frequency, and is not limited to the RF range.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:
1. An apparatus for processing an electronic signal, comprising:
   a voltage-to-current converter comprising an input port a bias port, and an output port, the input port receiving the electronic signal, and the bias port receiving a bias adjust signal, wherein the voltage-to-current converter is con- figured to convert voltage of the electronic signal at the input port to an output current signal at the output port; and a power detector configured to detect a power level of the electronic signal, and to provide a bias adjust signal to the bias port so as to adjust a bias current of the voltage-to-current converter to a value that increases substantially monotonically with the power level.

2. The system of claim 1, further comprising a mixer coupled to an output port of the voltage-to-current converter.

3. The system of claim 2, further comprising a local oscillator coupled to an input port of the mixer.

4. The system of claim 1, further comprising an amplifier coupled to an output port of the voltage-to-current converter.

5. The system of claim 1, wherein the electronic signal is a radio-frequency signal.

6. The system of claim 1, wherein the electronic signal has a power level in a range from −25 dBm to 0 dBm.

7. The system of claim 1, wherein the bias current has a value in a range from 25 mA to 85 mA.

8. The system of claim 1, wherein the voltage-to-current converter has a third-order intercept input power level of no smaller than 27 dBm, wherein the third-order intercept input power level corresponds to a level at which power in a third-order intermodulation products component of the output current signal is equal to power of an electronic signal component of the output current signal of the voltage-to-current converter.

9. The apparatus of claim 1, wherein the bias adjust signal is proportional to the root mean square (RMS) of a voltage of the electronic signal received at the input port.

10. The apparatus of claim 1, wherein a noise level due to the bias current of the voltage-to-current converter decreases as the bias current of the voltage-to-current converter decreases.

11. An radio-frequency mixer circuit comprising:
a radio-frequency mixer having first and second differential input ports and a differential output port;
a voltage-to-current converter for converting a radio-frequency input-signal voltage into a radio-frequency input-signal current, the voltage-to-current converter being coupled to the first differential input port to provide the radio-frequency input signal current to the mixer;
a differential local oscillator coupled to the second differential input port of the mixer;
a detector coupled to the voltage-to-current converter and configured to measure a power level of the radio-frequency input signal and to provide a bias adjust signal indicative of the power level to the voltage-to-current converter, thereby adjusting bias currents in the voltage-to-current converter and the mixer based on the power level, such that one or more of the bias currents increase substantially monotonically with the power level.

12. The radio-frequency mixer circuit of claim 11, wherein the bias adjust signal is proportional to the root mean square (RMS) of the radio-frequency input signal voltage.

13. The radio-frequency mixer circuit of claim 11, wherein the mixer circuit has a dynamic range of input frequencies from about 100 MHz to about 6 GHz.

14. The radio-frequency mixer circuit of claim 11, wherein the mixer is a doubly balanced active mixer.

15. The radio-frequency mixer circuit of claim 11, wherein the bias current in the mixer is adjustable in a range from 80 mA to 140 mA.

16. The radio-frequency mixer circuit of claim 11, wherein the detector receives the radio-frequency input signal via the voltage-to-current converter.

17. The radio-frequency mixer circuit of claim 11, further comprising transformers at an input of the voltage-to-current converter and the output port of the mixer.

18. The radio-frequency mixer circuit of claim 11, wherein the mixer has a fixed gain regardless of the level of the radio-frequency input signal voltage.

19. The radio-frequency mixer circuit of claim 11, wherein the intermodulation distortion of the mixer circuit increases substantially linearly proportional to the bias current in the voltage-to-current converter.

20. The radio-frequency mixer circuit of claim 11, wherein a noise level due to the bias currents decreases as the bias current in the voltage-to-current converter decreases.

21. A method associated with a voltage-to-current converter, the method comprising:
providing an electronic signal to an input port of the voltage-to-current converter;
measuring a power level of the electronic signal; and
adjusting a bias current of the voltage-to-current converter to a value that increases substantially monotonically with the measured power level.

22. The method of claim 21, wherein the electronic signal is a radio-frequency signal.

23. The method of claim 22, wherein measuring the power level comprises converting the radio-frequency signal into a DC output signal.

24. The method of claim 23, wherein adjusting the bias current comprises providing the DC output signal as a bias-adjust signal to the voltage-to-current converter.

25. The method of claim 21, further comprising generating a bias adjust signal proportional to the root mean square (RMS) of a voltage of the electronic signal, wherein adjusting the bias current comprises using the bias adjust signal.

* * * * *

UNITED STATES PATENT AND TRADEMARK OFFICE
CERTIFICATE OF CORRECTION

| | | Page 1 of 1 |
|---|---|---|
| PATENT NO. | : 7,999,599 B2 | |
| APPLICATION NO. | : 12/625016 | |
| DATED | : August 16, 2011 | |
| INVENTOR(S) | : Balboni | |

It is certified that error appears in the above-identified patent and that said Letters Patent is hereby corrected as shown below:

At column 4, line 64, in Claim 1, please change "port" to --port,--.

Signed and Sealed this
Third Day of April, 2012

David J. Kappos
*Director of the United States Patent and Trademark Office*